United States Patent
Bueti et al.

(10) Patent No.: US 8,132,136 B2
(45) Date of Patent: *Mar. 6, 2012

(54) DYNAMIC CRITICAL PATH DETECTOR FOR DIGITAL LOGIC CIRCUIT PATHS

(75) Inventors: Serafino Bueti, Waterbury, VT (US); Kenneth J. Goodnow, Essex Junction, VT (US); Todd E. Leonard, Williston, VT (US); Gregory J. Mann, Winfield, IL (US); Peter A. Sandon, Essex Junction, VT (US); Peter A. Twombly, Shelburne, VT (US); Charles S. Woodruff, Charlotte, VT (US)

(73) Assignee: International Business Machines Corporation, Armonk, NY (US)

(*) Notice: Subject to any disclaimer, the term of this patent is extended or adjusted under 35 U.S.C. 154(b) by 611 days.

This patent is subject to a terminal disclaimer.

(21) Appl. No.: 11/937,111

(22) Filed: Nov. 8, 2007

(65) Prior Publication Data

US 2009/0044160 A1 Feb. 12, 2009

Related U.S. Application Data

(63) Continuation-in-part of application No. 11/834,110, filed on Aug. 6, 2007.

(51) Int. Cl.
*G06F 17/50* (2006.01)
(52) U.S. Cl. ...................................................... 716/108
(58) Field of Classification Search .................. 716/1, 6, 716/100, 108
See application file for complete search history.

(56) References Cited

U.S. PATENT DOCUMENTS

| | | | | |
|---|---|---|---|---|
| 5,719,783 A * | 2/1998 | Kerzman et al. | .................. | 716/6 |
| 5,724,250 A * | 3/1998 | Kerzman et al. | .................. | 716/3 |
| 6,114,880 A * | 9/2000 | Buer et al. | ...................... | 327/39 |
| 6,415,402 B2 | 7/2002 | Bishop et al. | | |
| 6,516,362 B1 * | 2/2003 | Magro et al. | .................... | 710/58 |
| 7,941,772 B2 * | 5/2011 | Bueti et al. | ..................... | 716/106 |
| 2004/0034844 A1 * | 2/2004 | Beerel et al. | .................... | 716/18 |
| 2005/0007154 A1 * | 1/2005 | Patella et al. | ..................... | 327/2 |
| 2006/0263913 A1 | 11/2006 | Marshall | | |

(Continued)

FOREIGN PATENT DOCUMENTS
WO 99/17186 4/1999

OTHER PUBLICATIONS

Notice of Allowance dated Jan. 6, 2011, in U.S. Appl. No. 11/834,110.

(Continued)

*Primary Examiner* — Suchin Parihar
(74) *Attorney, Agent, or Firm* — David Cain; Roberts Mlotkowski Safran & Cole, P.C.

(57) ABSTRACT

Method for correcting timing failures in an integrated circuit and device for monitoring an integrated circuit. The method includes placing a first and second latch near a critical path. The first latch has an input comprising a data value on the critical path. The method further includes generating a delayed data value from the data value, latching the delayed data value in the second latch, comparing the data value with the delayed data value to determine whether the critical path comprises a timing failure condition, and executing a predetermined corrective measure for the critical path. The invention is also directed to a design structure on which a circuit resides.

20 Claims, 7 Drawing Sheets

U.S. PATENT DOCUMENTS

| | | | |
|---|---|---|---|
| 2007/0164787 A1* | 7/2007 | Grochowski et al. | 326/46 |
| 2008/0174353 A1* | 7/2008 | Badar et al. | 327/276 |
| 2008/0201671 A1* | 8/2008 | Rejouan et al. | 716/6 |
| 2008/0307277 A1* | 12/2008 | Tschanz et al. | 714/726 |
| 2009/0115468 A1* | 5/2009 | Berthold et al. | 327/141 |
| 2010/0153895 A1* | 6/2010 | Tetelbaum et al. | 716/6 |
| 2010/0153896 A1* | 6/2010 | Sewall et al. | 716/6 |

OTHER PUBLICATIONS

Final Office Action dated Oct. 14, 2010, in U.S. Appl. No. 11/834,110.

Non-Final Office Action dated Jun. 16, 2010, in U.S. Appl. No. 11/834,110.

* cited by examiner

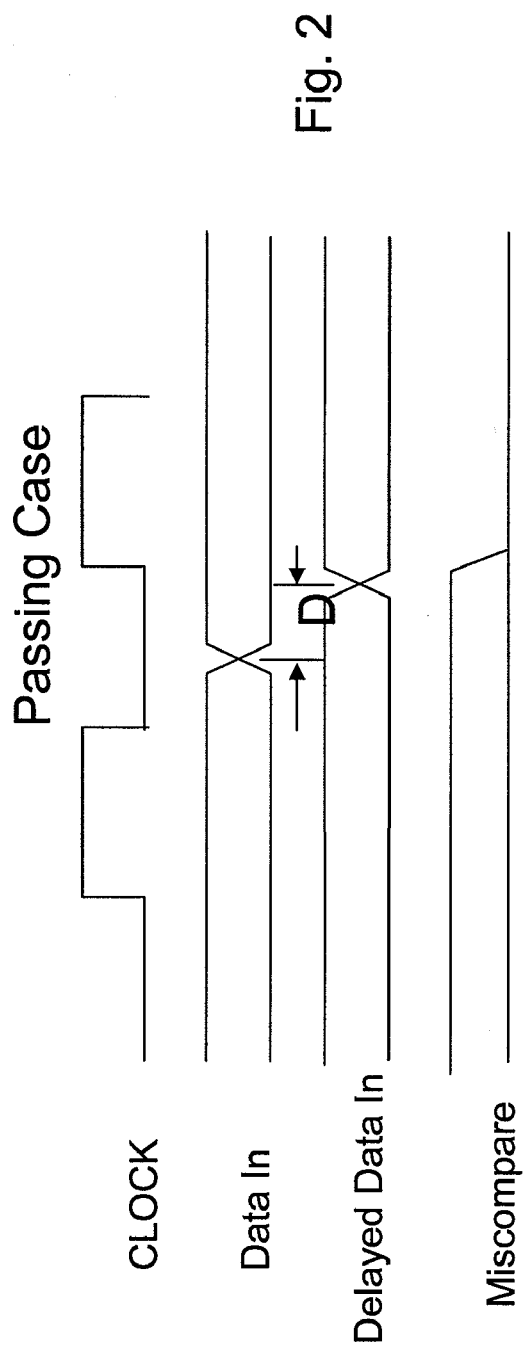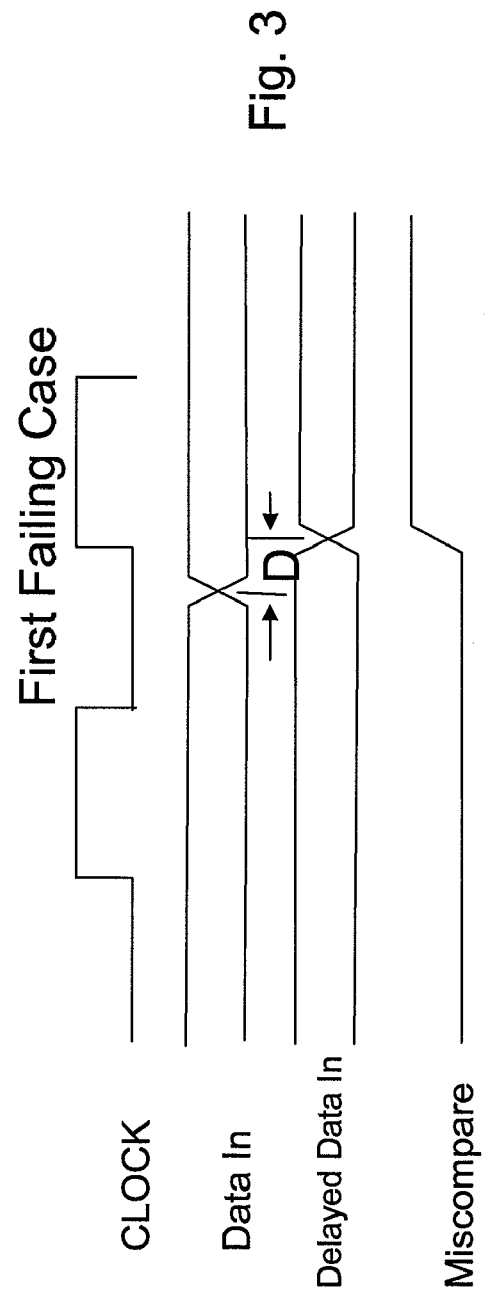

US 8,132,136 B2

DYNAMIC CRITICAL PATH DETECTOR FOR DIGITAL LOGIC CIRCUIT PATHS

CROSS-REFERENCE TO RELATED APPLICATIONS

The present application is a continuation in part of U.S. application Ser. No. 11/834,110, filed on Aug. 6, 2007, the disclosure of which is expressly incorporated by reference herein in its entirety.

FIELD OF THE INVENTION

The invention generally relates to methods and devices to monitor an integrated circuit, and in particular to monitor and correct for process variation in semiconductor chips, e.g., at worse case conditions. The invention is also directed to a design structure on which a circuit resides.

BACKGROUND OF THE INVENTION

Semiconductor integrated circuit chips are normally designed in view of process variations in forming the circuits. Specifically, process variations are presumed, and semiconductor integrated circuit chips are designed such that they will operate reliably for desired performance within the presumed range of process variation. However, since it is difficult to presume device performance variations, the period of time required to design semiconductor integrated circuit chips is increased, and it is necessary to give timing margins to allow semiconductor integrated circuits to operate in worst-cases, the semiconductor integrated circuit chips thus designed tend to suffer performance reductions.

In view of this process variation in today's technologies, additional design time is likewise required in order to close timing at worst-case conditions, e.g., in the classic four timing corners, on integrated circuit chips. In the classic four timing corners, the four corners are worst-case process and worst-case temperature and voltage; worst-case process and best-case temperature and voltage; best-case process and worst-case temperature and voltage; and best-case process and best-case temperature and voltage. The best-case process with high voltage and low temperature yields fast switching circuits, while worst-case process with low voltage and high temperature yields slow switching circuits. While very few chips are ever produced or operated in these worst-case extremes, designers design for the rare event in which the chips are produced or operated in these extremes. Moreover, because many of the gates formed on the integrated circuit chips are built with larger more powerful FETs to ensure the chips will close timing at worst-case conditions, additional power is required on the chips.

Today, there are several different methods to maintain integrated circuits as operational when process variation causes the chips to be operated out of their specifications, i.e., at worst-case condition. These methods include, but are not limited to, raising the voltage, reducing the frequency, back bias, etc. These methods can be applied for the life of the chip or only after a specified period of time has elapsed.

Other solutions in the marketplace today monitor the chip or areas of the chip performance in order to minimize the chip power. These solutions use performance scan-ring oscillators (PSROs) to monitor performance and to insure the power on the chip stays below a predetermined level. However, as it is the PSRO on the chip being monitored rather than the critical paths themselves, this method results in a very coarse measurement. Further, as other solutions monitor how much margin is in the path for sorting purposes, the path is not continuously monitored.

As a result of the above-noted methods, the chips designed to address production or operation in the worse case extremes needlessly waste power, area and time.

SUMMARY OF THE INVENTION

The invention is directed to a method for correcting timing failures in an integrated circuit. The method includes placing a first and second latch near a critical path. The first latch has an input including a data value on the critical path. The method further includes generating a delayed data value from the data value, latching the delayed data value in the second latch, comparing the data value with the delayed data value to determine whether the critical path includes a timing failure condition, and executing a predetermined corrective measure for the critical path.

According to aspects of the invention, a device for monitoring an integrated circuit includes a first latch arranged in a region of a critical path and structured to receive a data signal, a second latch arranged in a region of the critical path, a delay element structured and arranged to couple a delayed version of the data signal to the second latch, and a comparator device structured and arranged to compare outputs of the first and second latches. A miscompare from the comparator device is indicative of an approaching timing failing condition.

According to other aspects of the invention, a method for monitoring an integrated circuit includes applying a data signal to a first latch, applying a delayed version of the data signal to a second latch, and comparing outputs of the first and second latches. A miscompare from the comparing of outputs is indicative of an approaching timing failing condition in a path in a region of the first and second latches.

In yet another aspect of the invention, a design structure is embodied in a machine readable medium for designing, manufacturing, or testing a design. The design structure comprises: a first latch arranged in a region of a critical path and structured to receive a data signal; a second latch arranged in a region of the critical path; a delay element structured and arranged to couple a delayed version of the data signal to the second latch; and a comparator device structured and arranged to compare outputs of the first and second latches. A miscompare from the comparator device is indicative of an approaching timing failing condition.

In embodiments, the design structure comprises a netlist, which describes the circuit. The design structure resides on storage medium as a data format used for the exchange of layout data of integrated circuits. The design structure includes at least one of test data files, characterization data, verification data, or design specifications. The design structure embodied further comprises a component for: placing a first and second latch near a critical path, wherein the first latch has an input comprising a data value on the critical path; generating a delayed data value from the data value; latching the delayed data value in the second latch; comparing the data value with the delayed data value to determine whether the critical path comprises a timing failure condition; and executing a predetermined corrective measure for the critical path.

BRIEF DESCRIPTION OF THE DRAWINGS

FIG. 2 illustrates timing diagrams for a passing path;
FIG. 3 illustrates timing diagrams for a failing path;

DETAILED DESCRIPTION OF EMBODIMENTS OF THE INVENTION

According to the invention, the integrated circuit chip can check its own critical paths and make adjustments to ensure and/or maintain proper operation of the chip. By way of example, timing the integrated circuits closer to the nominal point will produce a less power hungry chip and will decrease the time to market. In order to account for the chips that end up in the worse case conditions, the critical paths can be monitored so any corrective action can be taken before the chip fails. This can ensure the chip is able to run at its desired cycle time. Further, the chip may consume less power and may require less time to get into manufacturing.

In order to time chips closer to nominal conditions, the invention monitors areas throughout the chip to determine whether chip timing for a particular path is close to failing, and, if so, takes corrective action before the path fails timing. The invention relates to identifying when and where to apply corrective measures to maintain a chip operation. According to embodiments, the invention can determine which paths are getting close to or approaching failure and correct those areas of the chip. By way of example, the invention can utilize a circuit designed to detect when margin is being lost in a critical path and to enable corrective action to be taken.

According to the invention, designers can concentrate on the area in which the vast majority of the chips will operate, rather than on the other areas in which only a minority of the chip will operate. As a result, a smaller chip die can be realized, as well as lower power consumption due to lower voltage requirements, a faster time to market, and better yields.

Figure 1:
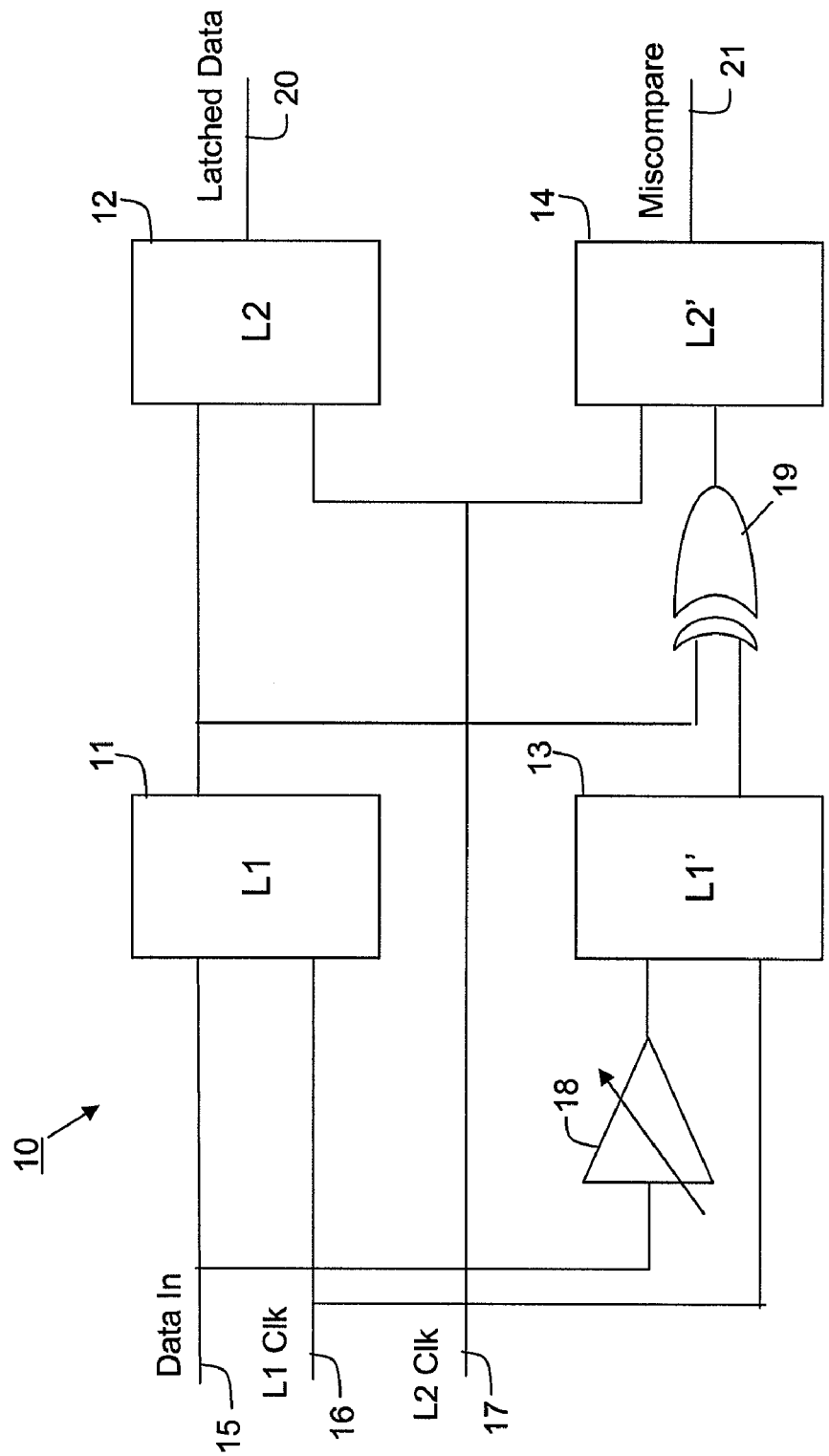
FIG. 1 illustrates a circuit according to the invention for monitoring whether paths are near failing.

FIG. 1 illustrates circuit 10, e.g., a monitoring latch, that can be formed or arranged on the integrated circuit chip to monitor whether a particular path is getting close to failing. Circuit 10 includes a latch pair composed of data flip flops L1 11 and L2 12 and a latch pair composed of delayed data flip flops L1' 13 and L2' 14. Moreover, latches L1 11 and L1' 13 are arranged to receive a data signal from line data-in 15 and clocking signals from L1 clock 16. A delay element 18, e.g., an adjustable delay element, is arranged to output a delayed version of the data signal to latch L1' 13. A comparator element 19 is arranged to compare the outputs of latches L1 11 and L1' 13 and the output of comparator element 19 is coupled to latch L2' 14, while the output of latch L1 11 is coupled to latch L2 12. Latches L2 12 and L2' 14 are coupled to receive clocking signals from L2 clock 17 and to output a latched data signal 20 and a miscompare signal 21, respectively.

According to the invention, paths on the integrated circuit chip are tested to determine whether any are approaching failing timing. In embodiments, circuit 10 operates to compare the data captured by latch L1 11 to the delayed version of the data captured by latch L1 11, i.e., in latch L1' 13. Further, FIGS. 2 and 3 illustrate timing diagrams for the clock, data-in, delayed data-in, and miscompare signals in a passing case and failing case, respectively.

As depicted in the timing diagrams of FIG. 2, the data-in signal input to latch L1 11 is delayed a time D by delay element 18 to form the delayed data-in signal input to latch L1' 13. As the data-in signal and the delayed data-in signal each occur within the same clock pulse, the miscompare signal is output low, indicating the path passes. In other words, a path passes or is within the acceptable operating parameters when the signal in arrives at least D, i.e., the delay time, before the clock pulse.

Like the timing diagrams of FIG. 2, the timing diagrams of FIG. 3 show the data-in signal input to latch L1 11 is delayed a time D by delay element 18 to form the delayed data-in signal input to latch L1' 13. However, in contrast to the passing case example in FIG. 2, the data-in signal and the delayed data-in signal occur in different clock pulses, so the miscompare signal is output high, which can be indicative of a path getting close to failing timing. Thus, if the signal in arrives later than D, i.e., the delay time, from the next clock pulse, the outputs of L1 11 and L1' 13 will not be equal, so the path will be identified as getting close to failing or operating outside acceptable operating parameters.

Thus, the invention allows critical paths to be measured in real time and to monitor individual paths rather than merely sections of the chip. This offers finer granularity and on the fly prediction of failing paths which allows corrective action to be taken before the path results in data being corrupted in the chip.

In addition to the detection of a miscompare, the invention also relates to corrective action that can be taken before the chip fails. By way of example, if the delay element 18 is a variable delay element, then a determination can be made at test as to how much margin the paths have. This information can be utilized in selecting one of the corrective actions.

According to an embodiment of the invention, if, while the chip is running, the monitor detects a path getting close to failing, a corrective action can be taken before the timing fails and causes a logic error. After a period of time after the corrective action, the path may be checked again and, if the timing is no longer close to failing, the corrective measure can be removed. Such an instance may occur, e.g., when a temperature rising in a certain region of the chip causes the monitor to detect a path in the region as getting close to failing. The corrective action could be, e.g., to raise the voltage to the region. Then, after a period of time, the temperature in the region may have decreased so that the monitor no longer detects a close to failing condition for the path. Thus, the invention ensures the chip maintains its frequency requirement while also running at a lowest possible power.

Figure 4:
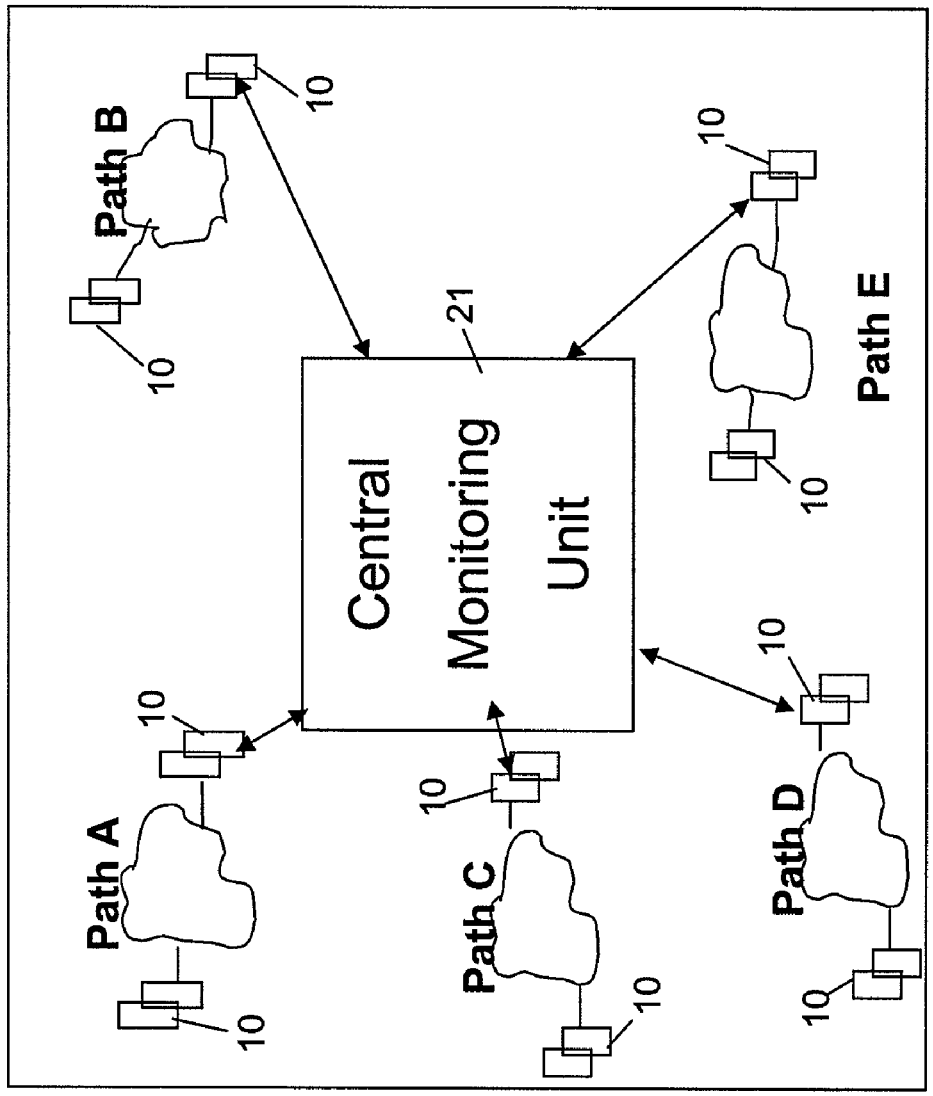
FIG. 4 illustrates a chip-level view of an integrated circuit chip according to the invention.

While the invention has been discussed with regard to an exemplary path and monitoring device, it is understood a number of monitoring units can be arranged throughout the integrated circuit chip to monitor potentially troublesome paths. By way of example, FIG. 4 illustrates a chip-level view of an integrated circuit chip 20 composed of a Central Monitoring Unit (CMU) 21 to control the monitoring of paths A-E on the chip. Paths A-E can be critical paths that have been selected for monitoring. CMU 21 is responsible for, e.g., calibrating the chip, monitoring each path to be sure the paths are being exercised and to determine whether any of the paths are getting close to failure, taking corrective actions, which can be applied on local or global levels, and setting the chip up after reset. By way of example, the corrective actions can include, but are certainly not limited to, adjusting back bias, adjusting pipeline depth, turning hybrid current mode logic (CML) circuits from single ended to dual ended, and increasing voltage.

Further, it is noted when a number of paths without a lot of margin are arranged to go through a central "pinch point," the pinch point can be monitored for approaching failure. Circuits 10 for each monitored path can be coupled to CMU 21. In this regard, CMU 21 can further change the margin and/or set the delay time in circuits 10.

In an exemplary implementation, when the integrated circuit chip according to the invention powers up, it will need to make sure that all the paths are functional. The reason is, if the data-in signal path does not get to L1 11 in time to be captured, the delayed version of the data-in signal will also not capture the correct logic level. As a result, the comparison of the L1 11 and L1' 13 outputs will indicate the path is functioning correctly, when, in fact, it may not. To ensure all the paths are functional when the hardware comes back, an at-speed built-in self test (BIST) could be run to ensure all of the paths on the chip are functional. If the tests fail, then corrective actions can be taken.

Figure 5:
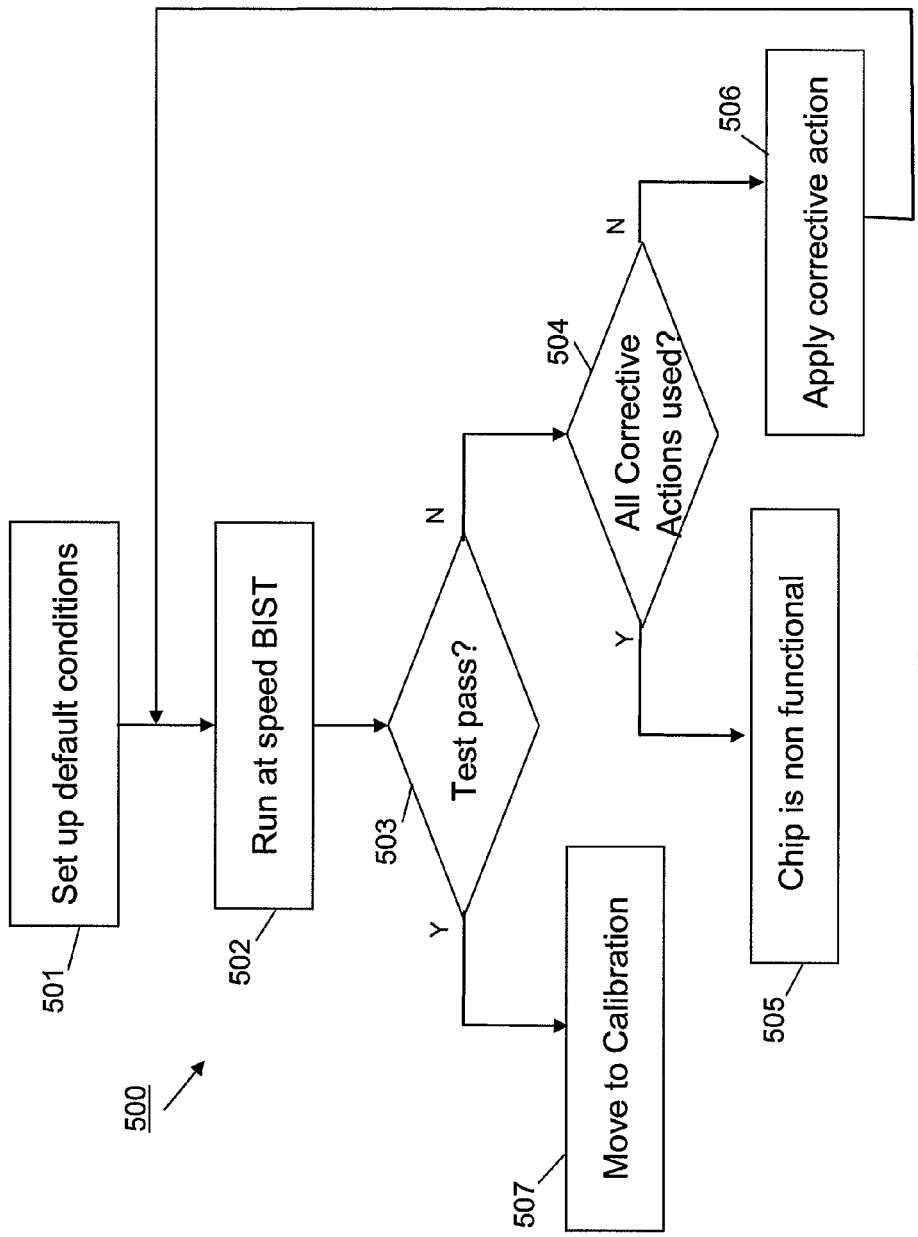
FIG. 5 illustrates an exemplary flow diagram for determining whether a chip is operational.

An exemplary flow diagram 500 for testing the chip at power up is illustrated in FIG. 5. Flow diagram 500 can perform basic checks to ensure the chip is operational before a calibration step. The chip will set up or load all its default settings at step 501 before running a chip-level at-speed BIST at step 502. If the test passes, then the chip can move on to calibrating the individual paths at step 507. An exemplary calibration procedure is described below with reference to FIG. 6. If at step 503 a determination is made the tests fails, the chip will check to see if all possible corrective actions have been taken at step 504. If all possible corrective actions the chip can make have been made, a determination is made at step 505 that the chip is non-functional and must be replaced. If the determination at step 503 is that all the corrective actions have not yet been taken, the chip will apply a corrective action at step 506 and retest the chip at step 502. This corrective action loop can continue until all corrective actions have been used without success or the test passes at step 503. Since the CMU is monitoring the whole chip, the corrective actions could start locally and move to a chip-wide level. For example, a first corrective action could be to change the local back bias on the circuit close to failing. Moreover, the CMU would also be able to take more chip-wide actions such as raising the voltage to multiple paths when it is determined they are getting close to the point of failure.

In addition to simply monitoring critical paths and correcting them, the present invention provides for exercising the critical paths so, when the critical paths occur, the delays have not degraded to points where the paths miss by amounts greater than or equal to the delays. If this degradation were to happen, the data signal comparison in the latches L1 11 and L1' 13 would not detect the failure. Accordingly, it is advantageous to periodically check the critical paths, which can be done, by way of example, in the following manners:

1) Training cycle. At predetermined intervals, a pattern can be run to exercise the critical path. This method would be a performance hit in some sections of the chip, since the chip would not be performing useful work during these training cycles. These training cycles can be very useful in sections of the chip that are not often used, but when needed must work, e.g., floating point units. The section of the chip containing the path would have to be removed from functional operation before the training cycle is run and returned to functional operation after the training cycle has been performed.

2) Monitor and train. The paths can be monitored to see if the critical paths were covered. If a predetermined period of time passes without critical paths being exercised, then the chip can run a training sequence for that section of logic.

3) Design. When a chip is designed to exercise the paths often, the path does not need to be checked, e.g., a cache miss line. If the path is not used very often, then the path is not important to the performance of the chip. Thus, breaking the path into multiple cycles shouldn't be problematic.

The present invention also provides a process for picking paths for monitoring. In synthesis, the miscompare latch can be used as the target latch. After initial placement and timing, the miscompare latch can be switched for normal latch pairs, e.g., L1/L2 latch, for all latches having a large amount of margin. The monitor latch's compare lines can be connected to a central location where a controller would look for miscompares and take corrective action. By using this method, either a periodic training period can be utilized or an assumption can be made you are covering all the critical paths you will detect when the chip is starting to lose some of its timing margin.

Further, a predetermined number of paths can also be selected, e.g., before synthesis or after initial placement, and it may be preferable to pick the paths before synthesis, which may provide more flexibility in picking which path will be monitored to insure that the critical path is executed. This can be advantageous in that the controller can be designed and/or built to handle a smaller number of paths. This method also allows the advantage of ensuring the monitoring of paths from different sections of the chip and/or on different clock domains.

Once the critical path detectors have been placed, they can be used at test to determine the amount of margin the chip has and then the voltage, back bias, frequency, etc. can be adjusted to give the fastest clock and the lowest voltage. Moreover, while the chip is operational, the critical path detectors can be used to determine if sections of the chip are getting close to not meeting the timing requirements and corrective action can be taken before data becomes corrupted. To accomplish this, the invention can further utilize a calibration step and a monitor and correction step.

Figure 6:
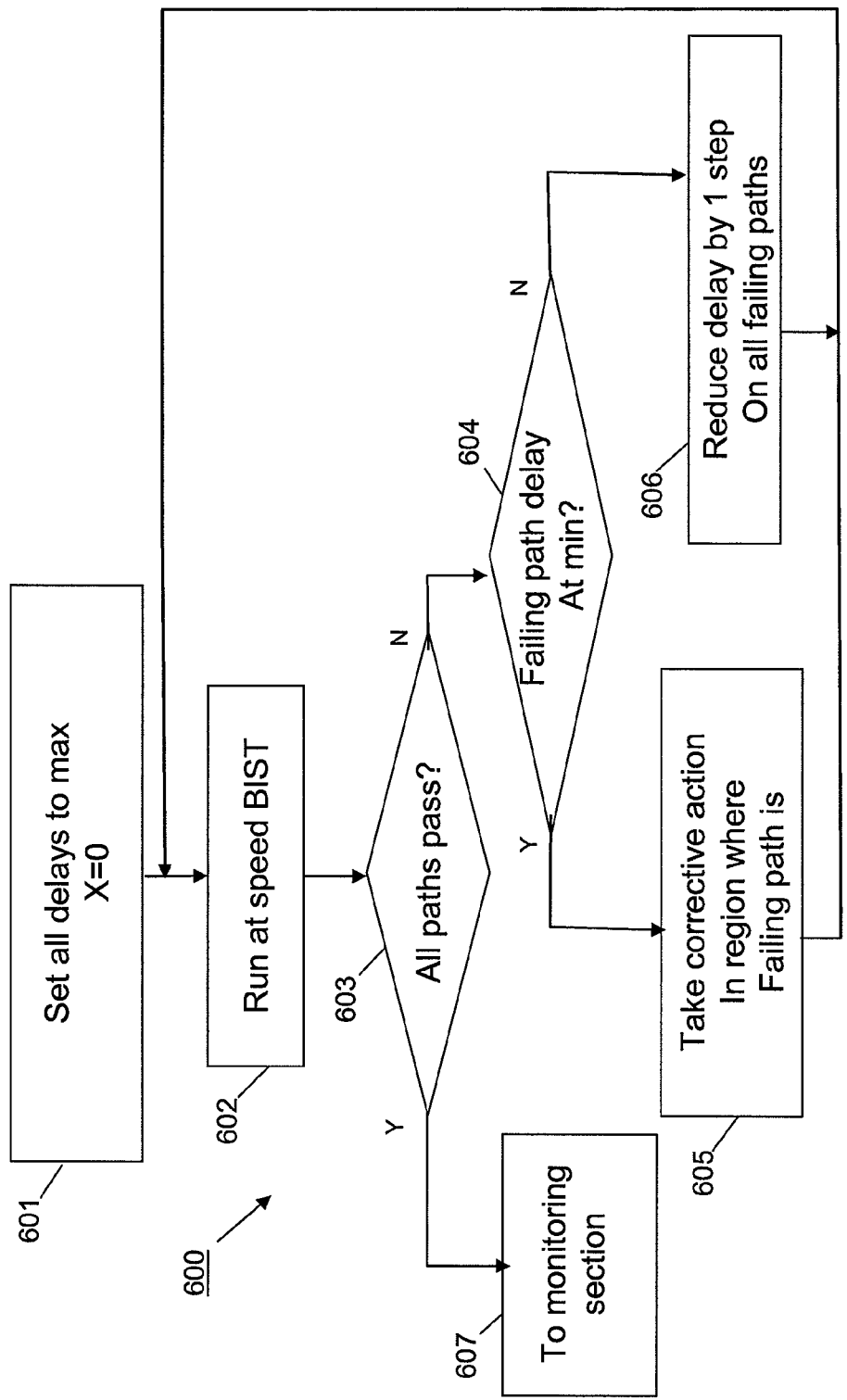
FIG. 6 illustrates an exemplary flow diagram for a calibration process.

A flow diagram for a calibration process 600 is shown in FIG. 6. This process can be utilized to set up the amount of margin for each of the paths. At step 601, all delays may be set to the Max value and the variable (X) that keeps track of which path the central monitor is working on is set to 0. An at-speed BIST is run at step 602, and a determination is made at step 603 whether all paths pass. When all paths pass, control can move to a monitoring section at step 607. An exemplary monitoring procedure is described below with reference to FIG. 7. When all paths do not pass, each failing path can be checked to see if the delay is at the minimum at step 604. If the delay is at the minimum value, a corrective action can be taken at step 605 in a region where the failing path is situated. If the delay is not at the minimum, then the delay will be reduced by 1 step on each failing path at step 606, and the path will be tested again at step 602. The corrective actions can be a series of actions, e.g., the first time the voltage can be increased and the next time back bias applied, etc.

Figure 7:
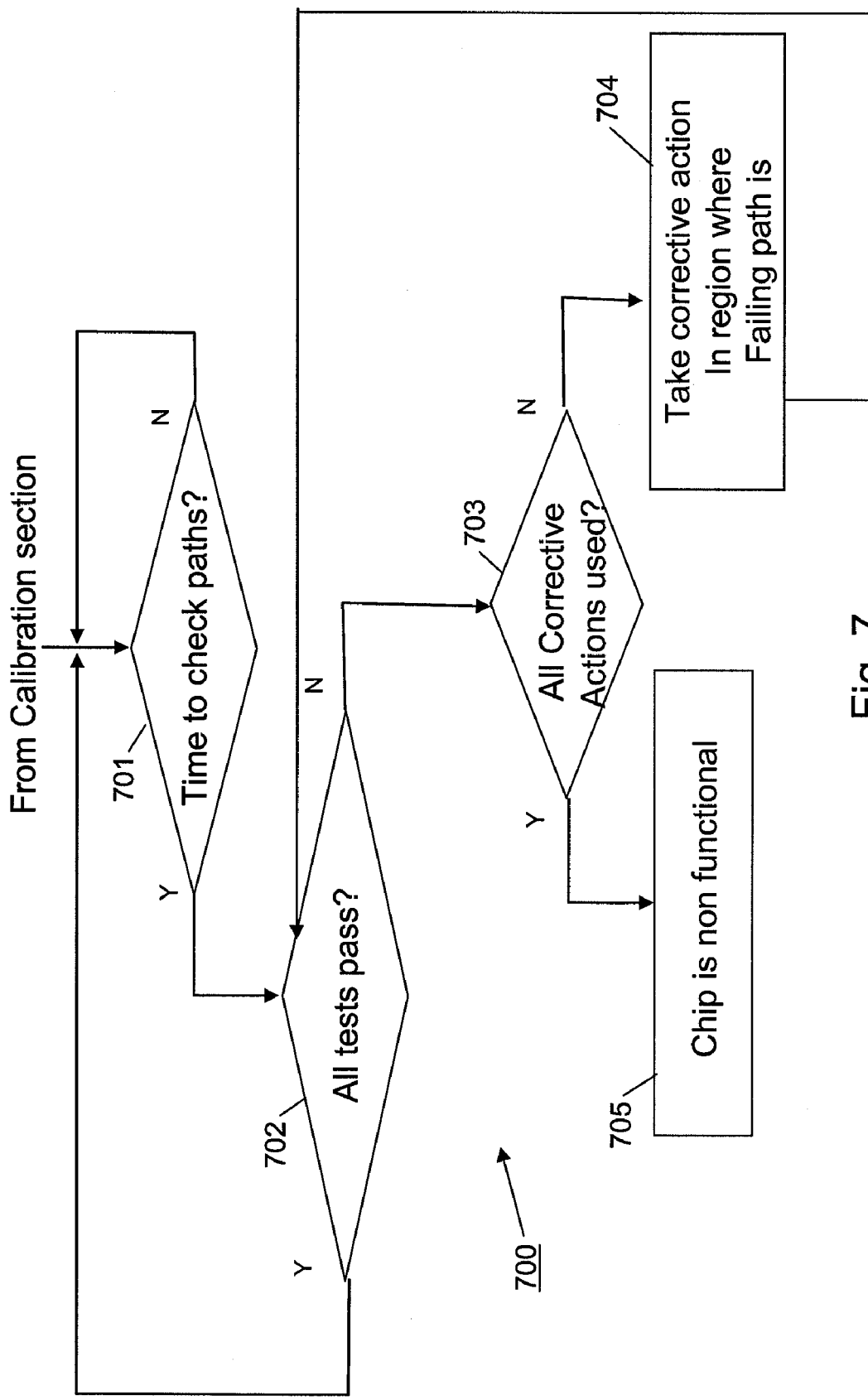
FIG. 7 illustrates an exemplary flow diagram for a monitoring section.

An exemplary process 700 for the monitoring section referred to above in step 607 is depicted in FIG. 7. In the monitoring section, the paths can be monitored to determine whether the paths are near failing and whether corrective action is necessary. The corrective actions can be, e.g., local to begin with and more global if multiple paths start to fail. When a determination is made at step 607 of the calibration process that all paths passed, the monitoring section determines at step 701 whether it is time to check the paths. In this regard, the determination can always be yes, which can allow for constant monitoring of the paths. When not constantly monitored, and it is not time to check the paths, the process returns to step 701. Thus, in contrast to the constant monitored paths, the process at step 701 can keep track of conditions such as temperature or activity and only start checking the paths in particular areas if the temperature or activity increase. By way of example, if it is assumed no data is flowing through a particular area of the chip, so long as the temperature is not increasing in this area, it may not be necessary to check the paths in this area of the chip. At step 702, a determination is made whether all paths pass. When all paths pass, the process returns to step 701. If a path is seen to be failing then a determination is made whether all corrective actions have been taken at step 703. If all corrective actions have not been made, a corrective action is taken in a region where the failing path is located at step 704 and then the path would be rechecked at step 702 to insure that all paths now pass. The corrective actions can be a series of actions, e.g., the first time the voltage could be increased and the next time back bias applied, etc. When all corrective actions have been used, a determination is made at step 705 that the chip is non-functional.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed. Moreover, the process as described above is used in the fabrication of integrated circuit chips.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Figure 8:
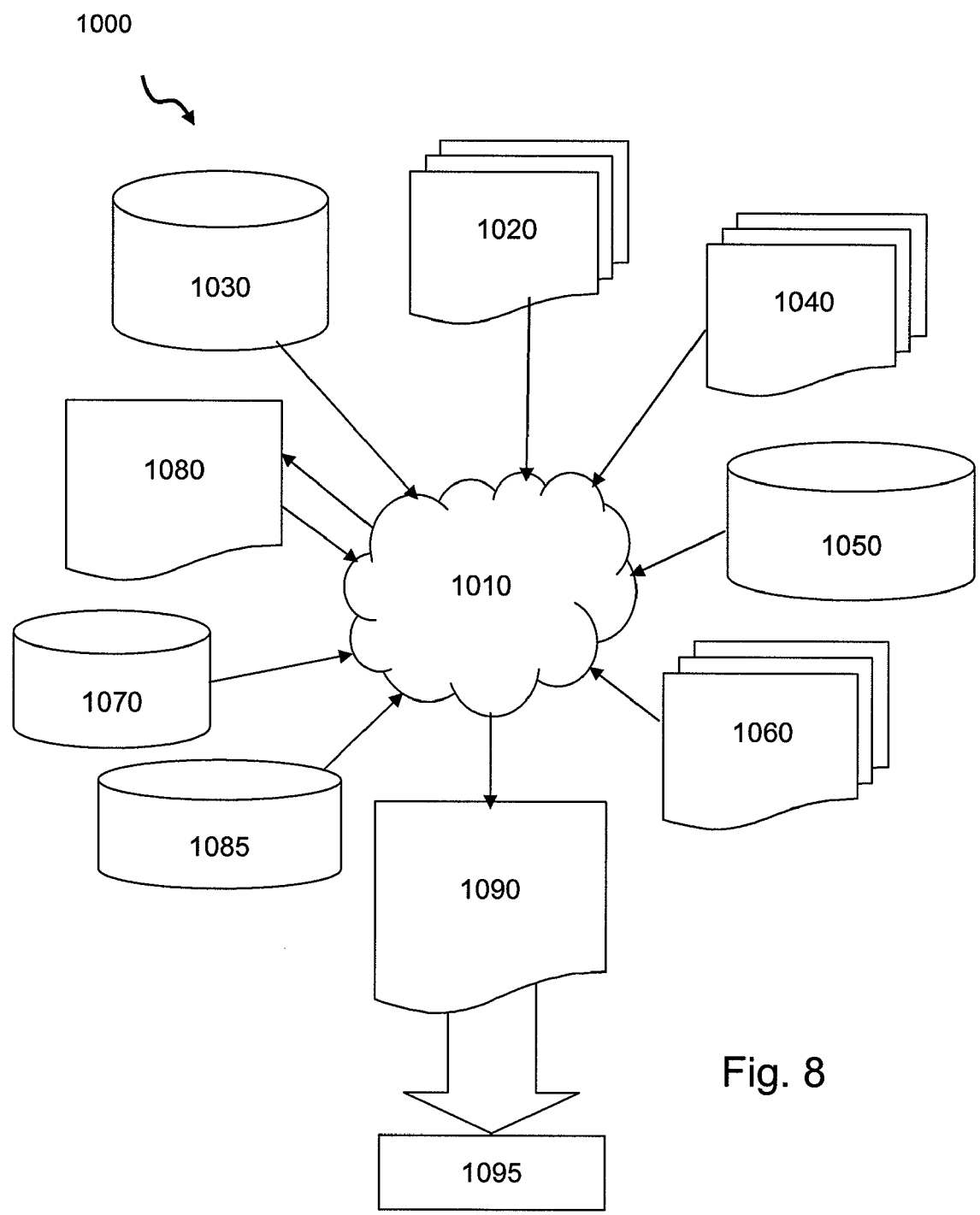
FIG. 8 is a flow diagram of a design process used in semiconductor design, manufacturing, and/or test.

FIG. 8 is a flow diagram of a design process used in semiconductor design, manufacturing, and/or test. FIG. 8 shows a block diagram of an example design flow 1000. Design flow 1000 may vary depending on the type of IC being designed. For example, a design flow 1000 for building an application specific IC (ASIC) may differ from a design flow 1000 for designing a standard component. Design structure 1020 is preferably an input to a design process 1010 and may come from an IP provider, a core developer, or other design company or may be generated by the operator of the design flow, or from other sources. Design structure 1020 comprises the circuit of FIG. 1, for example, in the form of schematics or HDL, a hardware-description language (e.g., Verilog, VHDL, C, etc.). Design structure 1020 may be contained on one or more machine readable medium. For example, design structure 1020 may be a text file or a graphical representation of circuits of the present invention. Design process 1010 preferably synthesizes (or translates) the circuit(s) of the present invention into a netlist 1080, where netlist 1080 is, for example, a list of wires, transistors, logic gates, control circuits, I/O, models, etc. that describes the connections to other elements and circuits in an integrated circuit design and recorded on at least one of machine readable medium. This may be an iterative process in which netlist 1080 is resynthesized one or more times depending on design specifications and parameters for the circuit.

Design process 1010 may include using a variety of inputs; for example, inputs from library elements 1030 which may house a set of commonly used elements, circuits, and devices, including models, layouts, and symbolic representations, for a given manufacturing technology (e.g., different technology nodes, 32 nm, 45 nm, 90 nm, etc.), design specifications 1040, characterization data 1050, verification data 1060, design rules 1070, and test data files 1085 (which may include test patterns and other testing information). Design process 1010 may further include, for example, standard circuit design processes such as timing analysis, verification, design rule checking, place and route operations, etc. One of ordinary skill in the art of integrated circuit design can appreciate the extent of possible electronic design automation tools and applications used in design process 1010 without deviating from the scope and spirit of the invention. The design structure of the invention is not limited to any specific design flow.

Design process 1010 preferably translates an embodiment of the invention as shown in the accompanying figures such as, for example, FIG. 1, along with any additional integrated circuit design or data (if applicable), into a second design structure 1090. Design structure 1090 resides on a storage medium in a data format used for the exchange of layout data of integrated circuits (e.g. information stored in a GDSII (GDS2), GL1, OASIS, or any other suitable format for storing such design structures). Design structure 1090 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in the accompanying figures such as, for example, FIG. 1. Design structure 1090 may then proceed to a stage 1095 where, for example, design structure 1090 proceeds to tape-out, is released to manufacturing, is released to a mask house, is sent to another design house, is sent back to the customer, etc.

While the invention has been described in terms of the identified embodiments, those skilled in the art will recognize that the invention can be practiced with modifications within the spirit and scope of the appended claims.

What is claimed is:

1. A method in a computer-aided design system for generating a functional design model of a dynamic critical path detector, the method comprising:

generating, by a processor, a functional representation of a first latch arranged in a region of a critical path and structured to receive a data signal;

generating a functional representation of a second latch arranged in a region of the critical path;

generating a functional representation of a delay element to couple a delayed version of the data signal to the second latch; and generating a functional representation of a comparator device positioned between an output and input of two components of the second latch and structured and arranged to compare outputs of the first and second latches, wherein:
a miscompare from the comparator device is indicative of an approaching timing failing condition and the miscompare occurs when the output of the first latch and the output of the second latch occur within different clock pulses; and the output of the first latch and the output of the second latch occur within different clock pulses when the output of the first latch occurs before a leading edge of a first clock pulse and the output of the second latch occurs after a trailing edge of a second clock pulse.

2. The method of claim 1, wherein the functional design model comprises a netlist, which describes the circuit.

3. The method of claim 1, wherein the functional design model e resides on storage medium as a data format used for the exchange of layout data of integrated circuits.

4. The method of claim 1, wherein the functional design model includes at least one of test data files, characterization data, verification data, or design specifications.

5. A method in a computer-aided design system for generating a functional design model of a dynamic critical path detector, the method comprising:

generating, by a processor, a functional representation of a first latch pair and second latch pair near a critical path, wherein the first latch pair has an input comprising a data value on the critical path;

generating a functional representation of a delay element to generate a delayed data value from the data value and to latch the delayed data value in the second latch pair;

generating a functional representation of a comparator device to compare the data value with the delayed data value to determine whether the critical path comprises a timing failure condition; and generating a functional representation of a device to execute a predetermined corrective measure for the critical path, wherein:
a miscompare from the comparator device occurs when the data value and the delayed data value occur within different clock pulses and the miscompare is indicative of the timing failure condition; and the data value and the delayed data value occur within different clock pulses when the data value occurs before a leading edge of a first clock pulse and the delayed data value occurs after a trailing edge of a second clock pulse.

6. The method of claim 1, wherein:
the first latch is a first latch pair; and
the second latch is a second latch pair.

7. The method of claim 6, wherein the delay element is single delay element at the input of the second latch.

8. The method of claim 7, wherein the single delay element is positioned at an input side of a latch of the second latch pair.

9. The method of claim 8, wherein the two components of the second latch pair is a first latch and a second latch, and the comparator device is positioned between the first and second latch of the second latch pair.

10. The method of claim 9, wherein the comparator device is positioned between an output of the first latch of the second latch pair and an input of the second latch of the second latch pair.

11. The method of claim 10, wherein the comparator device is positioned at an output of the first latch of the first latch pair.

12. The method of claim 10, wherein the first latch pair are flip flop latches and the second latch pair are delayed flip flops latches.

13. The method of claim 11, wherein a second latch of the first latch pair and second latch pair are coupled together.

14. The method of claim 6, wherein the first latch pair are flip flop latches and the second latch pair are delayed flip flops latches.

15. The method of claim 6, wherein a second latch of the first latch pair and second latch pair are coupled together.

16. The method of claim 1, wherein the delay element is single delay element at the input of the second latch.

17. The method of claim 5, wherein the comparator device is positioned between an output of a first latch of the first latch pair and the second latch pair, and an input of a second latch of the second latch pair.

18. The method of claim 5, wherein the delay element is a single delay element at an input of the second latch pair.

19. The method of claim 5, wherein the first latch pair is a flip flop latch pair and the second latch pair is a delayed flip flop latch pair.

20. The method of claim 5, wherein the first latch pair and second latch pair are coupled together.

* * * * *